United States Patent [19]
McCary

[11] Patent Number: 6,081,122
[45] Date of Patent: *Jun. 27, 2000

[54] ELECTRICAL GROUND FAULT DETECTION APPARATUS

[75] Inventor: Brian D. McCary, St. Louis, Mo.

[73] Assignee: Bausch & Lomb Surgical, Inc., Claremont, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/488,918

[22] Filed: Jun. 9, 1995

[51] Int. Cl.$^7$ .................................................. G01R 31/14
[52] U.S. Cl. ........................................... 324/509; 324/510
[58] Field of Search .................................... 324/509, 510; 340/650; 361/42–50

[56] References Cited

U.S. PATENT DOCUMENTS

| | | | |
|---|---|---|---|
| 3,976,987 | 8/1976 | Anger | 340/255 |
| 4,368,498 | 1/1983 | Neuhouser | 361/48 |
| 4,423,569 | 1/1984 | Stern et al. | 51/101 LG |
| 4,437,464 | 3/1984 | Crow | 128/303.14 |
| 4,793,345 | 12/1988 | Lehmer | 128/303.13 |
| 4,857,830 | 8/1989 | Matsuno | 324/62 |
| 4,970,656 | 11/1990 | Lo et al. | 364/481 |
| 5,001,649 | 3/1991 | Lo et al. | 364/484 |
| 5,230,347 | 7/1993 | Weinstein et al. | 128/740 |

OTHER PUBLICATIONS

Chirlian, Paul, Basic Network Theory, McGraw Hill, Inc., pp. 79, 37, 137, 1969.

Hayt and Kemmerly, Engineering Circuit Analysis, McGraw Hill, Inc., pp. 488 and 515, 1978.

*Primary Examiner*—Josie Ballato
*Assistant Examiner*—Russell M. Kobert
*Attorney, Agent, or Firm*—Grant D. Kang

[57] ABSTRACT

A ground detection apparatus for sensing the presence of a malfunction within an electronic instrument. The apparatus includes an active electrical circuit for delivering electrical energy from a power source to an electrically-driven instrument. The apparatus further includes a plurality of return electrical circuits connected in series with the active electrical circuit distal the electrically-driven instrument. A transformer coil is positioned within the apparatus such that the active electrical circuit includes a first winding about the transformer coil and such that one of the return electrical circuits includes a second winding about the transformer coil. The first and second windings are configured such that no substantial net flux is created in transformer coil when the plurality of return electrical circuits are functioning properly. The apparatus further includes a sensing and signalling circuit capable of sensing the presence of a flux in the transformer coil and producing a signal in response thereto. The circuit which the signal triggers has the capacity to deactivate the power.

13 Claims, 2 Drawing Sheets

ELECTRICAL GROUND FAULT DETECTION APPARATUS

BACKGROUND OF THE INVENTION

The present invention relates to an apparatus for detecting the failure of one or more wires of an electrical system. More particularly, the present invention is directed to an apparatus for detecting damage to or breakage of one or more return wires of an electrical instrument and for deactivating the delivery of energy to the electrical instrument upon the detection of damage.

The use of electrical instruments in the diagnosis and treatment of a variety of medical conditions is now commonplace. However, the use of such electrical equipment in direct contact with the body can pose significant risks to the patient in the event that there is an electrical malfunction in the instrument. For example, a patient can be subjected to electrical shocks or burns if the electrical instrument malfunctions while in contact with the human body. Additional harm may be incurred by the patient due to involuntary neuromuscular responses to electrical energy inadvertently directed to the body.

Electrical medical instruments can malfunction for a variety of reasons, including, but not limited to, damage to and breakage of wires within the instrument caused by repeated sterilization cycles which subject the wires to significant wear. For this reason, efforts have been made to develop technologies capable of reducing the risk of harming a patient in the event of an electrical malfunction as well as technology capable of detecting malfunctions within the electrical equipment.

Electrical medical instruments typically include an active electrical wire that delivers electrical energy to an electrically operated device and a return wire that allows electrical current to return to the power source from the electrically operated device. One example of an electrical medical instrument of this type is a phacoemulsification handpiece which includes an active electrical wire that delivers electrical energy from an electrical power source to a transducer which generates vibratory energy in response to the electrical energy. This vibratory energy is imparted to a phacoemulsification needle which is used to break up and remove a cataractous lens from the eye of a patient. Electrical current from the transducer is returned to the electrical power source through one or more return electrical wires.

A patient undergoing treatment with an electrical medical instrument is exposed to relatively little risk in the event that the active electrical wire breaks during use because electrical energy will not be delivered to the electrically operated device when the active electrical wire is broken. This mode of failure is also readily recognized by the medical specialist using the electrical medical instrument because the instrument will not operate when the active electrical wire is broken.

No such comfort level exists in the event that one or more of the return wires is damaged or broken due to the fact that the electrical medical instrument may continue to operate despite the malfunction. Thus, the medical specialist has no clear indication that the instrument has malfunctioned, although in certain cases an electrical shock may be delivered to the medical specialist when using the malfunctioning instrument. In addition, such a malfunction will simultaneously subject the patient to a significant risk of exposure to electrical energy and the injuries associated therewith due to the fact that the patient's body will become an alternative ground path for the electrical medical instrument.

In order to reduce the risks associated with the damage or breakage of a return electrical wire, some electrical medical instruments employ two or more return electrical wires, thereby providing multiple pathways through which electrical current can pass after leaving the electrically operated device and thereby reducing the likelihood that electrical energy will be delivered to the patient when only one of the return electrical wires is damaged or breaks. Although devices of this type may reduce the incidence of inadvertent delivery of electrical energy to a patient, they do not eliminate the problem at hand. Such devices do not provide any indication to the medical specialist that one or more of the return electrical wires is damaged or broken, nor do they prevent the delivery of electrical energy to the patient in the event that all of the return electrical wires are damaged or broken.

An alternative mechanism for reducing the risk of inadvertent delivery of electrical energy to a patient is disclosed in U.S. Pat. No. 4,793,345 to Lehmer. The Lehmer device employs two return electrical wires and monitors the respective current levels in each of the return wires through the use of a transformer core. When there is a current imbalance between the return wires caused by damage or breakage to one of the wires, a signal can be generated indicating that a current imbalance exists. However, it will be appreciated the Lehmer device fails to address the situation in which both of the return wires break simultaneously insofar as the current levels in both of the wires will be zero, i.e., balanced.

Another example of an apparatus for preventing the delivery of electrical energy to a patient is disclosed in U.S. Pat. No. 4,437,464 to Crow which is incorporated herein by reference. Crow discloses the use of a transformer core through which both an active electrical wire and a return electrical wire pass. The active and return electrical wires are wound about the transformer core in opposite directions such that only a minimal impedance is created by the transformer core when the respective currents in the active and return electrical wires are substantially equal, i.e., when neither the active nor the return electrical wire is damaged. The transformer core is further configured such that it produces a substantially larger impedance when the respective currents in the active and return electrical wires are not substantially equal, i.e., when one or both of these wires has been damaged or broken, thereby reducing the level of current passing through the apparatus to a level that does not pose a significant risk to the welfare of the patient. However, the Crow apparatus does not appear to be practical in many medical applications due to the fact that the transformer core must be relatively large in size to produce the magnitude of impedance required to reduce the current level through the apparatus to the degree required to protect the patient, thereby preventing the Crow apparatus from being incorporated into many small electrical instruments. Furthermore, the Crow apparatus continues to deliver reduced levels of current to the patient even after the return wire has been damaged. It is believed to be preferable to provide an apparatus that ceases the delivery of all electrical energy in the event that one or more of the return electrical wires is damaged or broken.

SUMMARY OF THE INVENTION

The apparatus of the present invention is configured for the detection of electrical faults in a electrical instruments. The apparatus includes an active wire capable of delivering electrical energy from an electrical power source to an electrically operated device. The apparatus further includes a transformer core about which the active wire is wound in a first direction. Two return wires capable of returning electrical energy to the electrical power source from the electrically operated device are also provided. One of the return wires is wound about the transformer core in a second direction opposite to the first direction. In addition, the return wire is wound about the transformer core twice as many times as the active electrical wires is wound about the transformer core. The apparatus further includes a sensing and signalling circuit having a capacity to sense a flux in the transformer core and having a capacity to generate a signal responsive to the presence of a flux in the transformer core. The circuit which the signal triggers has the capacity to deactivate the power.

BRIEF DESCRIPTION OF THE DRAWINGS

For a more complete understanding of the present invention, reference may be had to the following Detailed Description read in connection with the accompanying drawings in which.

DETAILED DESCRIPTION

Figure 1:
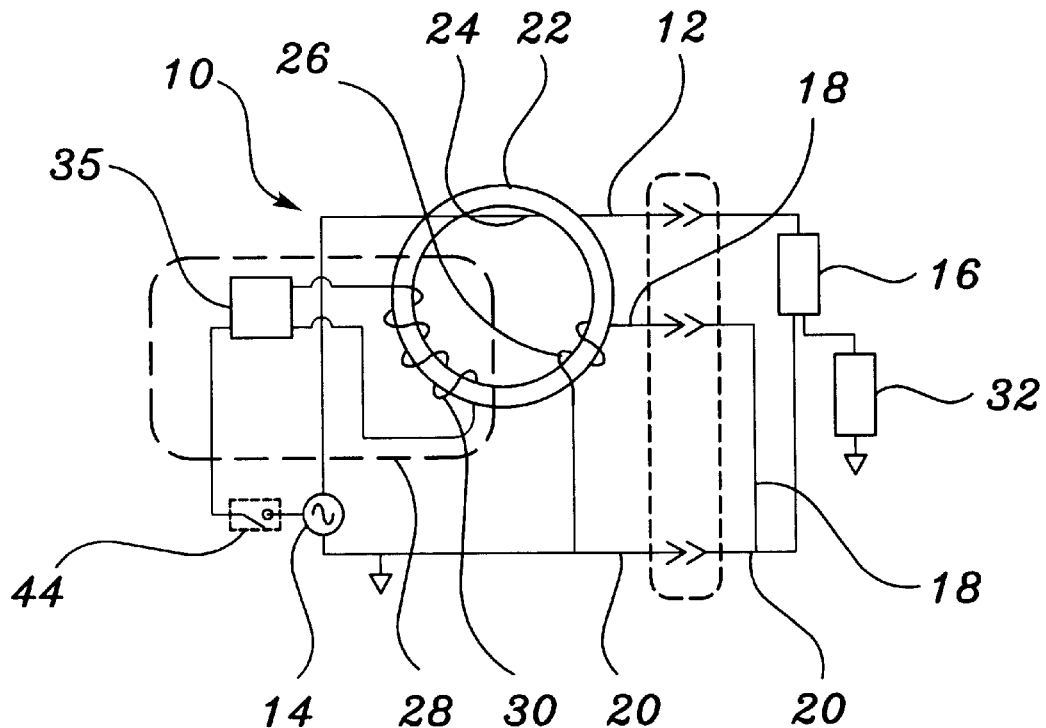
FIG. 1 is a schematic drawing of an electrical ground fault detection apparatus constructed in accordance with the present invention.

An electrical ground fault detection apparatus in accordance with the present invention is generally indicated at 10 in FIG. 1. Apparatus 10 is depicted in FIG. 1 and described in detail herein as being incorporated into a system including both an electrical power source and an electrically-driven instrument, as discussed in detail herein. However, apparatus 10 also can be configured as a stand-alone device that can be positioned between an existing electrical power source and an existing electrically-driven instrument in order to detect electrical malfunctions.

Apparatus 10 includes active electrical wire 12 capable of delivering electrical current from electrical power source 14 to electrically-driven instrument 16 at a level sufficient to drive instrument 16. For the purposes of this disclosure, active electrical wire 12 will be described as a single wire. However, it will be appreciated by one of ordinary skill in the pertinent art that active electrical wire 12 can be formed by a plurality of electrical wires, bundled or unbundled, and while functioning within the spirit and scope of the present invention.

The magnitude of electrical current required to drive instrument 16 will vary based upon the nature of instrument 16, the function being performed by instrument 16, and the environment in which instrument 16 is being operated. Instrument 16 can be a variety of electrically operated devices without departing from the intended spirit and scope of the present invention. By way of example, and not by way of limitation, instrument 16 can be a transducer within a phacoemulsification handpiece, in which case apparatus 10 can be incorporated into the phacoemulsification handpiece or can be incorporated in a phacoemulsification system that controls the operation of the phacoemulsification handpiece. As above-discussed, apparatus 10 also can be configured as a stand-alone device that can be placed between the phacoemulsification handpiece and the phacoemulsification system during use of the handpiece.

Apparatus 10 as depicted in FIG. 1 further includes first and second return electrical return wires 18, 20 capable of delivering electrical current from instrument 16 to electrical power source 14. For the purposes of this disclosure, return electrical wires 18, 20 will be described as a single wire. However, as with active electrical wire 12, it will be appreciated by one of ordinary skill in the pertinent art that return electrical wires 18, 20 can be formed by a plurality of electrical wires, bundled or unbundled, and still function within the spirit and scope of the present invention. First and second return electrical wires are connected in parallel to one another. In a preferred embodiment of the present invention, the respective impedances (real or resistive component only) of first and second return electrical wires 18, 20 are substantially equal such that substantially equal levels of electrical current will flow through each wire. However, as explained in detail herein, first and second return electrical wires 18, 20 can have different impedances (real or resistive component only) without departing from the spirit and scope of the present invention. In addition, it will be appreciated that apparatus 10 of the present invention can include three or more return electrical wires.

Apparatus 10 further includes a magnetic or transformer core 22 of known construction and operation. Active electrical wire 12 includes first winding 24 about transformer core 22, first winding 24 being in a first direction about transformer core 22. In the preferred embodiment of the present invention depicted in FIG. 1, first winding 24 is a single winding, thus providing simplicity to the design and operation of the present invention. However, it will be appreciated that first winding 24 can include any number of windings "X" about transformer core 22 where "X" is either a whole number or a fraction greater than zero.

Figure 1A:
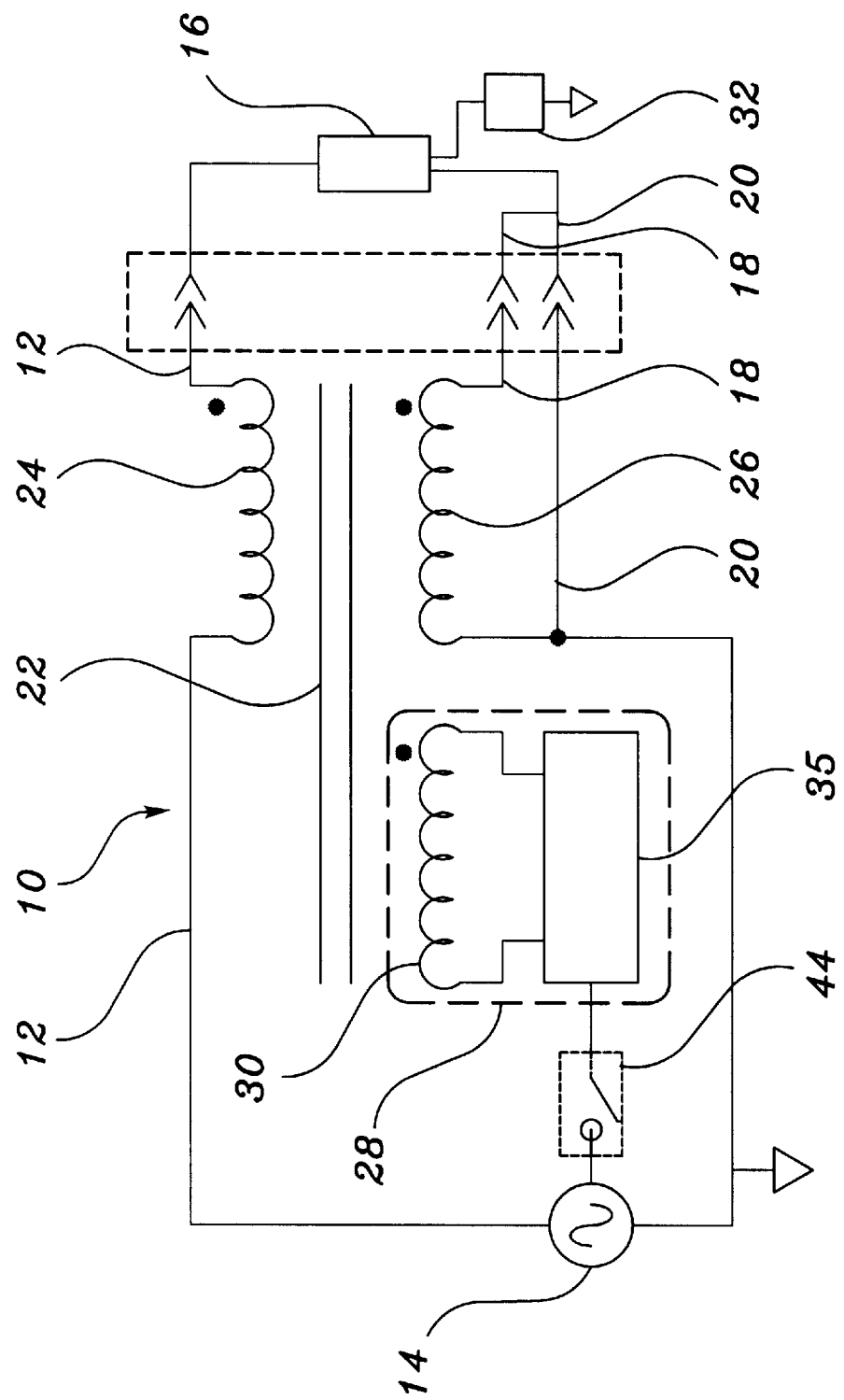
FIG. 1a is a drawing of FIG. 1 using dot convention.

First return electrical wire 18 includes second winding 26 about transformer core 22, second winding 26 being in a second direction opposite to the first direction of first winding 24. As above-discussed, the impedances of first and second return electrical wires 18, 20 are substantially equal in the preferred embodiment of the present invention. As illustrated in FIGS. 1 and 1a, return wire 20 does not wind about transformer core 22. In this preferred embodiment, second winding 26 is a double winding. Again, the preferred embodiment of the present invention provides simplicity to apparatus 10 to the extent that it minimizes the number of windings about transformer core 22. However, if first winding 24 is wound about transformer core 22 "X" times where "X" is a number other than one, second winding 26 is wound about transformer core 22 twice as many times as first winding 24, i.e., 2X times, provided that the impedances (real or resistive component only) of first and second return electrical wires 18, 20 are substantially equal.

In the above-discussed preferred embodiment of the present invention depicted in FIG. 1, first and second return electrical wires 18, 20 have substantially equal impedances (real or resistive component only) and therefore have substantially equal levels of current flowing through them during normal operation of apparatus 10. That is, the level of current flowing through first and second return electrical wires 18, 20 will be substantially one-half the current level in active electrical wire 12. First winding 24 therefore will produce a flux in transformer core 22 which is substantially equal in magnitude and opposite in direction to the flux created by second winding 26, thereby producing a substantially zero net flux in transformer core 22 when apparatus 10 is operating in its normal condition. However, in the event that the current levels in first and second return electrical wires 18, 20 are not substantially equal, i.e., in the event that one of first and second return electrical wires 18, 20 is damaged or broken, a net flux will be generated in transformer core 22. A net flux also will be generated in transformer core 22 when both of first and second return electrical wires 18, 20 break due to the fact that no current will be flowing through first return electrical wire 18. The presence of a net flux in transformer core 22 thus indicates that one or both of first and second return electrical wires 18, 20 has been damaged or is broken.

In an alternative embodiment of the present invention, apparatus 10 includes three or more return electrical wires. In this alternative embodiment, the return electrical wires preferably have substantially equal impedance (real or resistive component only) levels. Thus, the level of current flowing through each of the return electrical wires during normal operation of apparatus 10 will be substantially (I/N) where "N" is the number of return electrical wires and "I" is the current level flowing through active electrical wire 12. In this alternative embodiment, second winding 26 includes "NX" windings as above-discussed with respect to the preferred embodiment of the present invention depicted in FIG. 1. An alternative method for determining the number of turns required on return electrical wire 18 requires a determination of the respective currents passing through active electrical wire 12, i.e., I(a), and first return electrical wire 18, i.e., I(1), when apparatus 10 is in a non-ground fault state. The number of windings required is equal to $X \cdot (I(a)/I(1))$. This equation is applicable to all embodiments of the present invention, including embodiments in which more than two return electrical circuits are included and embodiments in which the impedances (real or resistive component only) of the return electrical circuits are equal or unequal.

In the embodiment of the present invention depicted in FIG. 1, apparatus 10 includes alternative ground path 32. Alternative ground path 32 can be formed by the patient's body. Alternative ground path 32 as depicted in FIG. 1 preferably has an impedance (real or resistive component only) significantly higher than the total impedance (real or resistive component only) of first and second return electrical wires 18, 20 such that current will flow through return electrical wires 18, 20 during normal operation of apparatus 10. exist in order for the device to detect the failure of one return wire. It will further be appreciated that while some form of alternative ground path 32 must exist to detect the simultaneous failure of both ground wires, if no such path exists, then neither the patient or the operator will feel a shock.

Apparatus 10 further includes sensing and signalling circuit 28 as generally depicted in FIG. 1. Sensing and signalling circuit 28 includes sensing winding 30 about transformer core 22. Sensing winding 30 can include any number of windings about transformer core 22 so long as a voltage signal is created in sensing winding 30 when a net flux exists in transformer core 22. It will be appreciated that the magnitude of the voltage signal created in sensing winding 30 will be proportional to the net flux in transformer core 22. As above-discussed, during normal operation of apparatus 10 there will be no substantial net flux in transformer core 22 and therefore no substantial voltage signal will be created in sensing winding 30. However, when there is an imbalance in the respective current levels of first and second return electrical wires 18, 20, the resulting flux in transformer core 22 will result in a voltage signal being generated in sensing winding 30, thereby causing sensing and signalling circuit 28 to generate a signal indicating the presence of a failure within apparatus 10. This signal preferably is directed to appropriate circuitry capable of deactivating electrical power source 14, thereby obviating the danger to the patient. In the preferred embodiment of the present invention, reactivation of electrical power source 14 following deactivation by sensing and signalling circuit 28 requires an intervening reset action by the operator, thereby ensuring that the medical specialist will not reuse the defective electrical medical instrument prior to proper servicing and also thereby avoiding the possibility that a subsequent patient will be injured by the malfunctioning instrument.

Figure 2:
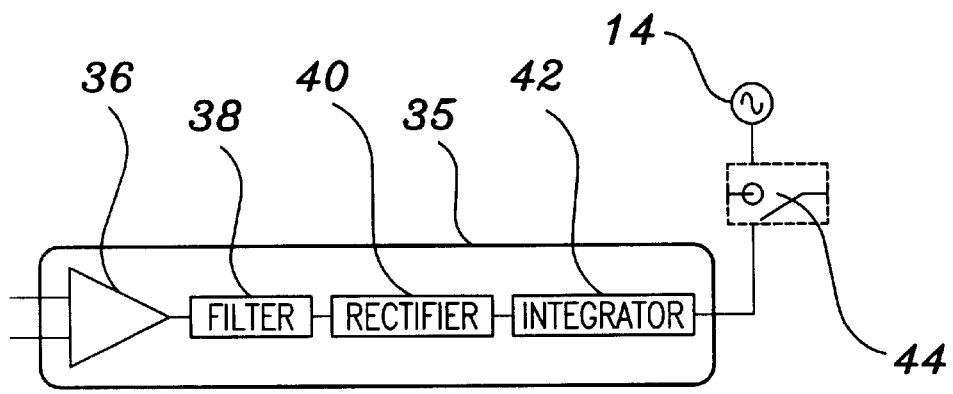
FIG. 2 is a schematic drawing of a sensing and signalling circuit of an electrical ground fault detection apparatus constructed in accordance with the present invention.

A portion 35 of sensing and signalling circuit 28 of the preferred embodiment of the present invention is depicted in greater detail in FIG. 2. Sensing and signalling circuit 28 includes pre-amp 36 which is an op-amp having a standard, non-inverting configuration. Pre-amp 36 amplifies the voltage signal generated on sensing winding 30 when a net flux exists about transformer coil 22. The presence of pre-amp 36 enables sensing and signalling circuit 28 to be used to detect relatively small fluxes in transformer core 22, thereby enabling apparatus 10 to be used effectively and safely with electrical medical instruments requiring relatively low current levels in their normal operation. It will be appreciated by one of ordinary skill in the pertinent art that pre-amp 36 can be eliminated in the event that it is not important for sensing and signalling circuit 28 to detect small fluxes in transformer core 22.

Sensing and signalling circuit 28 as depicted in FIG. 2 further includes filter 38 which is configured to remove high frequency noise from sensing and signalling circuit 28, thereby preventing the inadvertent disabling of electrical power source 14 due to excessive noise from surrounding electrical equipment. Also included in sensing and signalling circuit 28 is rectifier 40 which removes the negative component from the signal being transferred through sensing and signalling circuit 28 such that the resulting signal will not damage integrator 42. Integrator 42 is configured to filter out transient current imbalances within apparatus 10, thereby preventing the disablement of instrument 16 in cases where there has been a variation in current flow without an actual failure, e.g., in the event of an electrostatic discharge. The output of integrator 42 is directed to a latch or flip flop 44.

In the event that sensing and signalling circuit 28 detects a non-transient flux in transformer core 22, i.e., a possible malfunction or failure within apparatus 10, integrator 42 sends a signal to flip flop 44 which in turn causes electrical power source 14 to be deactivated. Flip flop 44 preferably will not permit instrument 16 to be reused after electrical power source 14 is deactivated without being reset during a service call. Thus, it is preferable that flip flop 44 be reset manually.

Although the apparatus of the present invention has been described herein with reference to certain preferred embodiments, it will be appreciated by one of ordinary skill in the art that various modifications can be made to the apparatus without departing from the spirit and scope of the present invention.

What is claimed is:

1. An electrical ground fault detection apparatus comprising:
   a transformer core;
   an active electrical circuit having a capacity to deliver electrical energy from an electrical power source to an electrically-driven instrument, said active electrical circuit including a first wire, said first wire including X windings about said transformer core in a first direction, where X is any number greater than zero;
   a plurality N of return electrical wires where N is an integer greater than one, said return electrical wires having a capacity to return electrical energy from said electrically-driven instrument to said electrical power source, said return electrical wires being configured to be connected in series with said active electrical circuit distal said electrically-driven instrument, said return electrical wires being connected in parallel with respect to one another, one of said return electrical wires including a second winding about said transformer core in a second direction opposite said first direction, said second winding including N·X windings about said transformer core, another of said return electrical wires not winding about said transformer core; and a sensing and signalling circuit having a low pass filter, a capacity to sense a flux in said transformer core, and a capacity to generate a signal when a flux exists in said transformer core.

2. An electrical ground fault detection apparatus in accordance with claim 1, wherein said sensing and signalling circuit comprises a sensing winding about said transformer coil, said sensing winding being configured such that an electrical voltage is induced thereon when a flux exists within said transformer coil.

3. An electrical ground fault detection apparatus in accordance with claim 2, wherein said sensing and signalling circuit further comprises a flip flop disposed in series with said sensing winding, said flip flop being configured such that an output of said flip flop deactivates said electrical power source when a flux exists within said transformer cell and such that said electrical power source remains deactivated until said flip flop is reset.

4. An electrical ground fault detection apparatus in accordance with claim 3, wherein said sensing and signalling circuit further comprises:

an amplifier connected in series with said sensing winding, said amplifier having a capacity to amplify said electrical voltage induced on said sensing winding when a flux exists within said transformer coil;

a rectifier connected in series with said sensing winding, said rectifier having a capacity to eliminate a negative component of said electrical voltage induced on said sensing winding when a flux exists within said transformer coil; and an integrator connected in series with said sensing winding, said integrator having a capacity to eliminate preselected transient electrical voltages induced on said sensing winding when a flux exists within said transformer coil, whereby said integrator prevents deactivation of said electrical power source in the event that preselected transient electrical voltages are induced on said sensing winding.

5. A ground fault detection apparatus in accordance with claim 1, wherein X is 1.

6. A ground fault detection apparatus in accordance with claim 5, wherein N is two and wherein said return electrical wires have substantially equal resistances.

7. An electrical ground fault detection apparatus in accordance with claim 1, wherein said signal generated by said sensing and signalling circuit has a capacity to deactivate said electrical power source when a flux exists in said transformer core.

8. An electronic medical device having an electrical ground fault detection system, said device comprising:

an electrically-driven instrument;

an electrical power source;

a transformer core;

an active electrical circuit having a capacity to deliver electrical energy from said electrical power source to said electrically-driven instrument, said active electrical circuit including a first wire, said first wire including X windings about said transformer core in a first direction, where X is any number greater than zero;

a plurality N of return electrical wire where N is an integer greater than one, said return electrical wires having a capacity to return electrical energy from said electrically-driven instrument to said electrical power source, said return electrical wires being connected in series with said active electrical circuit distal said electrically-driven instrument, said return electrical wires being connected in parallel with respect to one another, one of said return electrical wires including a second winding about said transformer core in a second direction opposite said first direction, said second winding including N·X windings about said transformer core, another of said return electrical wires not winding about said transformer core; and a sensing and signalling circuit having a low pass filter, a capacity to sense a flux in said transformer core, and a capacity to generate a signal when a flux exists in said transformer core.

9. An electrical ground fault detection apparatus comprising:

a transformer core;

an active electrical circuit having a capacity to deliver electrical energy from an electrical power source to an electrically-driven instrument, said active electrical circuit including a first wire have a single winding about said transformer core in a first direction;

first and second return electrical wires, said first and second return electrical wires having a capacity to return electrical from said electrically-driven instrument to said electrical power source, said return electrical circuits being configured to be connected in series with said active electrical circuit distal said electrically-driven instrument, said return electrical wires being connected in parallel with respect to one another, said first and second return electrical wires having substantially equal resistances, said first return electrical wire including a second winding about said transformer core in a second direction opposite said first direction, said second-winding including two windings about said transformer core, whereby said first winding and said second winding create opposing fluxes in said transformer core and whereby said opposing fluxes create a substantially zero net flux in said transformer core when said electrical ground fault detection apparatus is operating in a non-ground fault mode, said second return electrical wire not winding about said transformer core; and a sensing and signalling circuit having a low-pass filter, a capacity to sense a flux in said transformer core, and a capacity to generate a signal when a flux exists in said transformer core.

10. An electrical ground fault detection apparatus in accordance with claim 9, wherein said sensing and signalling circuit comprises a sensing winding about said transformer coil, said sensing winding being configured such that an electrical voltage is induced thereon when a flux exists within said transformer coil.

11. An electrical ground fault detection apparatus in accordance with claim 10, wherein said sensing and signalling circuit further comprises a flip flop disposed in series with said sensing winding, said flip flop being configured such that an output of said flip flop deactivates said electrical power source when a flux exists within said transformer cell and such that said electrical power source remains deactivated until said flip flop is reset.

12. An electrical ground fault detection apparatus in accordance with claim 11, wherein said sensing and signalling circuit further comprises:

an amplifier connected in series with said sensing winding, said amplifier having a capacity to amplify said electrical voltage induced on said sensing winding when a flux exists within said transformer coil;

a rectifier connected in series with said sensing winding, said rectifier having a capacity to eliminate a negative component of said electrical voltage induced on said sensing winding when a flux exists within said transformer coil; and an integrator connected in series with said sensing winding, said integrator having a capacity to eliminate preselected transient electrical voltages induced on said sensing winding when a flux exists within said transformer coil, whereby said integrator prevents deactivation of said electrical power source in the event that preselected transient electrical voltages are induced on said sensing winding.

13. An electrical ground fault detection apparatus comprising:

a transformer core;

an active electrical circuit having a capacity to deliver electrical energy from an electrical power source to an electrically-driven instrument, said active electrical circuit including a first wire, said first wire including X windings about said transformer core in a first direction, where X is any number greater than zero;

a plurality N of return electrical wires where N is an integer greater than one, said return electrical wires having a capacity to return electrical energy from said electrically-driven instrument to said electrical power source, said return electrical wires being configured to be connected in series with said active electrical circuit distal said electrically-driven instrument, said return electrical wires being connected in parallel with respect to one another, one of said return electrical wires including a second winding about said transformer core in a second direction opposite said first direction, said second winding including N·X windings about said transformer core, another of said return electrical wires having zero windings about said transformer core; and a sensing and signalling circuit having a low pass filter, a capacity to sense a flux in said transformer core, and a capacity to generate a signal when a flux exists in said transformer core.

* * * * *